United States Patent [19]

Tabei

[11] Patent Number: 4,570,070

[45] Date of Patent: Feb. 11, 1986

[54] ION-BEAM MONITOR

[75] Inventor: Masatoshi Tabei, Kanagawa, Japan

[73] Assignee: Fuji Photo Film Co., Ltd., Kanagawa, Japan

[21] Appl. No.: 619,760

[22] Filed: Jun. 12, 1984

[51] Int. Cl.[4] ............................................. G01N 23/22
[52] U.S. Cl. ................................. 250/372; 250/458.1;
250/492.2; 250/492.3
[58] Field of Search ...................... 250/397, 336.1, 398,
250/399, 372, 492.3, 484.1, 492.2, 483.1, 458.1

[56] References Cited

U.S. PATENT DOCUMENTS 3,601,575  8/1971  Meyer et al. .......................... 250/398
4,494,005  1/1985  Shibata et al. ........................ 250/397

OTHER PUBLICATIONS

EerNisse et al., "Ion Beam Profile Monitor", Rev. Sci. Instrum., 46 (3), Mar. 1975, pp. 266–267.

Primary Examiner—Alfred E. Smith
Assistant Examiner—Carolyn E. Fields
Attorney, Agent, or Firm—Sughrue, Mion, Zinn, Macpeak & Seas

[57] ABSTRACT

The ion-beam monitor determines the distribution of the ion beam intensity by scanning a flat pellet of $Al_2O_3$ with the ion beam and detecting the ultra violet radiation emitted from the $Al_2O_3$ pellet and recording the same at each step of the scanning operation.

3 Claims, 1 Drawing Figure

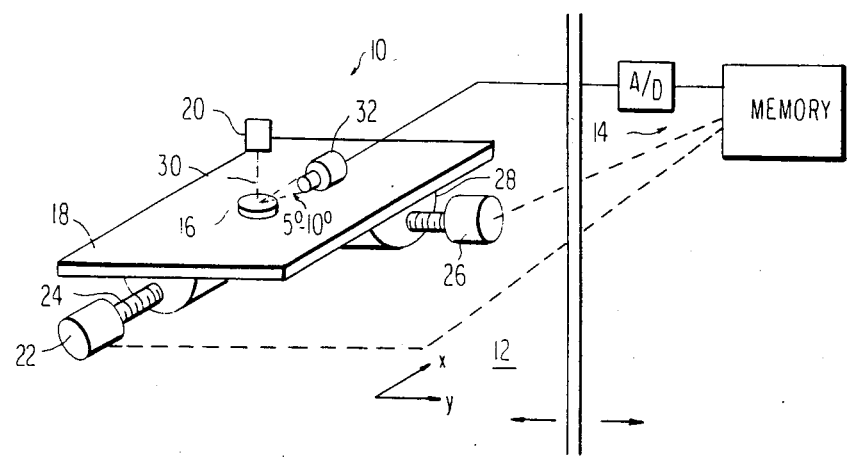

ION-BEAM MONITOR

BACKGROUND OF THE INVENTION

The present invention is directed to an ion-beam monitor and more specifically to an optical observation system for determining the distribution of ion-beam intensity.

A micro-machining process called "ion-beam milling" is generally known in the art and is used in semiconductor fabrication and other micro-lithography processes for removing materials. Typically, a milling machine of this type directs an ion beam towards a target marked by photo-resist material for the purpose of removing material in openings in the photo-resist. The workpiece is generally placed in a vacuum chamber filled with an inactive gas such as argon, and according to such a process, no side etching takes place, that is, no etching takes place beneath the photo-resist pattern. Therefore, the pattern machining accuracy with such a process is on a very high order. The maximum diameter of an ion beam of this type is approximately six inches, and the workpiece is generally in the form of a wafer having a substantially smaller diameter such as three to four inches. In such an ion-beam milling process, it is necessary that the ion beam is of uniform intensity at least within the range of the wafer. Prior to performing an ion-beam milling process, distribution of the beam intensity must be measured, and such conditions as ion beam focusing and the like must be adjusted in order to obtain a uniform distribution of ion beam intensity in order to enhance the accuracy and uniformity of the milling process. However, no effective process is known in the prior art for measuring the distribution of beam intensity with any degree of accuracy.

According to the prior art, attempts were made to measure ion beam intensity within a vacuum chamber filled with inactive gasses such as argon or the like. One method involved irradiating ion beams against a zinc plate to observe the green light emitted therefrom, and another method involved the measuring of the charge of the ion beams. In ion-beam milling, however, a thermionic emission device called a neutralizer is operated and therefore the foregoing methods are insufficient for measuring the ion beam intensity. This is due primarily to the fact that a visible light is present caused by the black body radiation from the neutralizer thereby rendering the measurement of the emission of light from the zinc plate virtually impossible. Furthermore, the charge of the beam is neutralized by the neutralizer and cannot be measured.

Another prior art method of monitoring ion-beam distribution is to melt a uniform layer and note the different resultant thicknesses. However, such a trial and error method has proved to be time consuming and inexact.

SUMMARY OF THE INVENTION

The present invention provides a new and improved ion-beam monitor for accurately measuring the ion beam intensity, and more specifically for accurately measuring the distribution of ion beam intensity across the diameter thereof.

The present invention provides a new and improved ion beam monitor for measuring the distribution of ion beam intensity within the range of ion-beam radiation, especially the range in which a wafer to be milled is placed, by the use of a material which emits ultra violet light irradiated with the ion beam. The materials sputtered by the radiation of ion beams show an emission spectrum peculiar to the atoms of the material. By using materials which emit ultra violet light, it is possible to detect the ultra violet light which is indicative of the distribution of ion beam intensity as the ion beam and wafer are moved relative to each other.

The foregoing and other objects, features and advantages of the invention will be apparent from the following more particular description of a preferred embodiment of the invention as illustrated in the accompanying drawings.

BRIEF DESCRIPTION OF THE DRAWINGS

The single FIGURE is a schematic view of the apparatus for monitoring the distribution intensity of an ion beam according to the present invention.

DETAILED DESCRIPTION OF THE INVENTION

The ion-beam monitor according to the present invention is basically comprised of an optical observation system which may be focused to observe the characteristic light emission from a small, flat test plate upon which an ion beam is impinged. The optical scanning system 10 may be located in a vacuum chamber 12 with the signal processing means 14 located externally of the chamber. The flat test plate 16, which may be an alumina pellet having a diameter of approximately 5 mm, is placed upon a platform 18 which is moveable in the XY direction relative to an ion beam source 20 located above the plate 16 in alignment therewith. The platform 18 is moved in the X direction by means of a scanning motor 22 which drives the platform 18 by a screw type drive mechanism 24. The platform 18 is moved in the Y direction by means of the scanning motor 26 which moves the platform 18 by means of a screw type transmission 28. The ion beam 30 from the source 20 has a diameter of approximately six inches, which is considerably greater than the 5 mm diameter of the alumina pellets. As the ion beam 30 strikes the alumina pellet, ultra violet light is emitted, and an ultra violet light detector 32 is mounted on the platform 18 to one side of the pellet 16 for receiving the ultra violet light. The receiving tube of the detector is disposed at an angle of approximately 5–10 degrees with respect to the surface of the platform 18. As the pellet is moved in the XY scanning directions, the intensity of the ultra violet light emission at each address is measured. This measurement of ultra violet light emission intensity can be effected by optically detecting only the light in that part by the use of a collimated optical system such as a photo conductive pipe or a channel plate, and then by leading the light to the ultra violet light detector through an ultra violet light filter and an optical fiber. The ultra violet light thus detected is memorized in the electronic control portion 14 of the system corresponding to the positions of the alumina pellet, and thus, the distribution of the ion beam intensity is measured.

Suitable means (not shown) may be provided for varying the tilt angle of the detector 32 in order to select the optimum position for receiving the ion beam. The small pellet 16 for the characteristic light emission can be changeable, but preferably has a level etch rate with high light emission intensity. $Al_2O_3$ was found to be suitable for this purpose and 308 mm or 395 mm line spectrum of the aluminum atom can be utilized. Table I lists various materials which could be used for the pellet 16 and the various parameters associated therewith.

It is obvious that the details of the present invention may be varied without varying the scope of the present invention. In addition to different types of materials for the sample pellets, the apparatus for scanning the ion beam to determine the intensity distribution can be varied. For example, it is obvious that the ion beam source could be moved to carry out the scanning operation while maintaining the pellet in a fixed position.

Therefore, while the invention has been particularly shown and described with reference to a preferred embodiment thereof, it will be understood by those in the art that various changes in form and details may be made therein without departing from the spirit and scope of the invention.

TABLE I

| Materials | Gain* | Wavelength | Major Peak Intensity | Assignment |
|---|---|---|---|---|
| Aluminum | 100 | 395 | 1.5 | |
| $Al_2O_3$ | 30 | 308 | 1.33 | 303.2, 309.3 Al |
|  | 30 | 395 | 1.35 | 374.4, 396.2 Al |
| Copper | 1000 | 325 | 5.0 | 374.8, 327.4 Cu |
| Nickel | 1000 | 341.5 | 2.9 | 341.5 Ni |
|  | 1000 | 345 | 3.4 | 346 Ni |
|  | 1000 | 351.5 | 2.9 | 352.4 Ni |
| AZ1350 | 1000 | 430 | 1.7 | 430 CH $(A^2 \Delta - X^2 \chi)$ |
| Polyamide | 1000 | 430 | 4.3 | |
| Silicon | 1000 | 252 | 9.5 | 252.4 Si |
|  | 1000 | 288 | 1.0 | 282.1 Si |

*Indicates what degree of gain is needed at the time of detection. The smaller the gain, the better the sensitivity.

What is claimed is:

1. An ion-beam monitor for determining the distribution of the ion beam intensity comprising ion beam source means, a flat pellet of a material which emits ultraviolet light when radiated by an ion beam and having a diameter substantially less than the diameter of said ion beam source means, scanning means for moving said ion beam source means and said pellet relative to each other and detection means for detecting the ultraviolet light during the scanning operation for producing a signal indicative of the ion beam intensity.

2. An ion-beam monitor as set forth in claim 1 wherein said pellet is comprised of $Al_2O_3$.

3. An ion-beam monitor as set forth in claim 1 wherein said scanning means is comprised of a platform supporting said pellet for reception of radiation from said ion beam source means and means for moving said platform in an X-Y scan relative to said ion beam source means.

* * * * *